(12) United States Patent
Kajino et al.

(10) Patent No.: US 12,424,473 B2
(45) Date of Patent: Sep. 23, 2025

(54) CENTERING DEVICE, CENTERING METHOD AND SUBSTRATE PROCESSING APPARATUS

(71) Applicant: SCREEN Holdings Co., Ltd., Kyoto (JP)

(72) Inventors: Itsuki Kajino, Kyoto (JP); Shoyo Minami, Kyoto (JP); Shuhei Nemoto, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 98 days.

(21) Appl. No.: 18/416,416

(22) Filed: Jan. 18, 2024

(65) Prior Publication Data

US 2024/0258144 A1    Aug. 1, 2024

(30) Foreign Application Priority Data

Jan. 27, 2023    (JP) ................. 2023-010982

(51) Int. Cl.
  *H01L 21/677*  (2006.01)
  *H01L 21/67*   (2006.01)
  *H01L 21/687*  (2006.01)

(52) U.S. Cl.
  CPC ......... *H01L 21/67718* (2013.01); *H01L 21/67017* (2013.01); *H01L 21/67259* (2013.01); *H01L 21/68707* (2013.01)

(58) Field of Classification Search
  None
  See application file for complete search history.

(56) References Cited

U.S. PATENT DOCUMENTS

| | | |
|---|---|---|
| 2015/0202774 A1 | 7/2015 | Blank et al. |
| 2018/0350632 A1 | 12/2018 | Kikumoto et al. |
| 2022/0288950 A1 | 9/2022 | Tani |
| 2022/0301900 A1 | 9/2022 | Ito et al. |
| 2023/0253231 A1 | 8/2023 | Ueno et al. |

FOREIGN PATENT DOCUMENTS

| | | |
|---|---|---|
| JP | H10-209249 A | 8/1998 |
| JP | 2011-181849 A | 9/2011 |
| JP | 2021-054562 A | 4/2021 |

(Continued)

OTHER PUBLICATIONS

Office Action for the corresponding Taiwanese Patent Application No. 113100874 issued on Jun. 25, 2024.

(Continued)

*Primary Examiner* — Natasha N Campbell
(74) *Attorney, Agent, or Firm* — Rimon P.C.

(57) ABSTRACT

A substrate supported on a substrate support is surrounded by a first contact member located at a first reference position, a second contact member located at a second reference position and a third contact member located at a third reference position in the horizontal plane. These three contact members gradually approach the substrate while keeping distances from a center of the substrate support equal by repeating the minute movements. The substrate posture is so adjusted that the direction of eccentricity is parallel to the virtual line prior to the start of the movements of the contact members. In the invention, the substrate posture is so adjusted that the direction of eccentricity is parallel to the virtual line prior to the above centering of the substrate.

10 Claims, 11 Drawing Sheets

(56) References Cited

FOREIGN PATENT DOCUMENTS

| | | |
|---|---|---|
| JP | 2022-146507 A | 10/2022 |
| JP | 2023-114594 A | 8/2023 |
| KR | 10-2005-0039509 A | 4/2005 |
| KR | 10-2015-0088207 A | 7/2015 |
| KR | 10-2018-0131446 A | 12/2018 |
| TW | 201943009 A | 11/2019 |
| TW | 202035251 A | 10/2020 |

OTHER PUBLICATIONS

Office Action dated Dec. 26, 2024, from corresponding Korean Patent Application No. 10-2024-0004900, 29 pages.

CENTERING DEVICE, CENTERING METHOD AND SUBSTRATE PROCESSING APPARATUS

CROSS REFERENCE TO RELATED APPLICATION

The disclosure of Japanese Patent Application No. 2023-010982 filed on Jan. 27, 2023 including specification, drawings and claims is incorporated herein by reference in its entirety.

BACKGROUND OF THE INVENTION

1. Field of the Invention

This invention relates to a centering technique for aligning a center of a disk-shaped substrate placed on the upper surface of a substrate support with a center of the substrate support and a substrate processing apparatus for processing a substrate utilizing the centering technique. This process includes a bevel etching process.

2. Description of the Related Art

In a known substrate processing apparatus, a chemical liquid process or a cleaning process is performed by supplying a processing liquid to a peripheral edge part of a substrate such as a semiconductor wafer while rotating the substrate. In an apparatus described in Japanese Patent Application Laid-Open No. 2022-146507, for example, a substrate is held under suction while being supported from below by a spin chuck (corresponding to an example of a "substrate support" of the present invention). In this case, misalignment between the center of the spin chuck and the center of the substrate decreases processing quality. In response to this, it is desirable to equip the above equipment with a centering device.

The centering device is for performing a so-called centering operation of reducing an amount of eccentricity of the substrate with respect to a spin chuck. A centering device for reciprocally moving movable bodies on axis lines radially extending from a center axis of the spin chuck in directions orthogonal to the center axis as described, for example, in JP H10-209249A can be adopted as the centering device.

SUMMARY OF INVENTION

Since at least three movable bodies need to be respectively reciprocally moved on the axis lines in the above centering device, the size enlargement of the device has been problematic. Accordingly, the inventors of this application developed a centering device including three contact members as shown in FIG. 3 to be described later to realize minimum movable bodies and reduce a device size. The three contact members are as follows.

(1) A first contact member movable in a first horizontal direction from a first reference position separated from a center of a substrate support by a reference distance longer than a radius of a substrate toward the center of the substrate support in a horizontal plane.

(2) A second contact member movable in a second horizontal direction different from a direction toward the center of the substrate support and extending toward the substrate from a second reference position deviated from a virtual line extending in the first horizontal direction from the center of the substrate support and separated from the center of the substrate support by the reference distance on a side opposite to the first contact member with respect to the center of the substrate support in the horizontal plane.

(3) A third contact member movable in a third horizontal direction different from a direction toward the center of the substrate support and extending toward the substrate from a third reference position separated from the center of the substrate support by the reference distance on a side opposite to the first contact member with respect to the center of the substrate support and opposite to the second contact member with respect to the virtual line in the horizontal plane.

In this centering device, minute movements of moving the first, second and third contact members respectively by a first movement amount, a second movement amount and a third movement amount so that distances of the first, second and third contact members from the center of the substrate support are kept equal are repeated, and the centering operation is completed by sandwiching the substrate by the first, second and third contact members.

However, a movement of the substrate moved by the contact members includes a movement component in the first horizontal direction (X direction to be described later) and a movement component in a horizontal direction (Y direction to be described later) orthogonal to the first horizontal direction. Particularly, as a direction of eccentricity of the substrate deviates from the virtual line (VL in FIGS. 3, 5, 6 and 8 to be described later) extending in the first horizontal direction from the center of a spin chuck, the latter movement component increases. Thus, in view of this point, there arise a restriction of setting the arrangement of the second and third contact members and a restriction of using a moving mechanism of a relatively high output to move the second and third contact members. As a result, a problem of largely restricting a degree of design freedom of the centering device newly arises.

This invention was developed in view of the above problem and aims to provide a centering technique having an excellent degree of design freedom and a substrate processing apparatus using this centering technique.

A first aspect of the invention is a centering device for positioning a substrate on a substrate support such that a center of the disk-shaped substrate placed in a horizontal posture on an upper surface of the substrate support is aligned with a center of the substrate support. The device includes: a first contact member movable in a first horizontal direction from a first reference position separated from the center of the substrate support by a reference distance longer than a radius of the substrate toward the center of the substrate support in a horizontal plane; a second contact member movable in a second horizontal direction from a second reference position deviated from a virtual line extending in the first horizontal direction from the center of the substrate support and separated from the center of the substrate support by the reference distance on a side opposite to the first contact member with respect to the center of the substrate support in the horizontal plane, the second horizontal direction being different from a direction toward the center of the substrate support and extending toward the substrate; a third contact member movable in a third horizontal direction from a third reference position separated from the center of the substrate support by the reference distance on a side opposite to the first contact member with respect to the center of the substrate support and opposite to the second contact member with respect to the virtual line in the horizontal plane, the third horizontal direction being different from a direction toward the center of the substrate support and extending toward the substrate; a moving mechanism configured to move the first contact member, the second contact member and the third contact member respectively in the first horizontal direction, the second horizontal direction and the third horizontal direction; a rotation driver configured to rotate the substrate support having the substrate placed thereon, a meter configured to measure a peripheral edge part of the substrate placed on the substrate support with the first contact member, the second contact member and the third contact member separated from an end surface of the substrate; and a controller configured to perform an aligning the substrate with respect to the substrate support by controlling the moving mechanism and the rotation driver, wherein the controller includes: an eccentricity information acquirer configured to acquire a direction of eccentricity of the center of the substrate from the center of the substrate support based on peripheral edge information about the peripheral edge part of the substrate measured by the meter; a substrate posture adjuster configured to adjust a posture of the substrate such that the direction of eccentricity is parallel to the virtual line by rotating the substrate support; and a movement controller configured to repeat minute movements of moving the first contact member, the second contact member and the third contact member respectively by a first movement amount, a second movement amount and a third movement amount until contact of all of the first contact member, the second contact member and the third contact member with the substrate is completed so that distances of the first contact member, the second contact member and the third contact member from the center of the substrate support are kept equal in a state where the direction of eccentricity is parallel to the virtual line.

A second aspect of the invention is a centering method for positioning a substrate on a substrate support such that a center of the disk-shaped substrate placed in a horizontal posture on an upper surface of the substrate support is aligned with a center of the substrate support. The method includes: (a) placing the substrate on the upper surface of the substrate support with a first contact member located at a first reference position separated from the center of the substrate support by a reference distance longer than a radius of the substrate, a second contact member located at a second reference position deviated from a virtual line extending through the center of the substrate support from the first reference position and separated from the center of the substrate support by the reference distance on a side opposite to the first contact member with respect to the center of the substrate support and a third contact member located at a third reference position separated from the center of the substrate support by the reference distance on a side opposite to the first contact member with respect to the center of the substrate support and opposite to the second 25 contact member with respect to the virtual line; (b) repeating minute movements of moving the first contact member in a first horizontal direction from the first reference position toward the center of the substrate support by a first movement amount, moving the second contact member in a second horizontal direction different from a direction toward the center of the substrate support and extending toward the substrate from the second reference position by a second movement amount and moving the third contact member in a third horizontal direction different from a direction toward the center of the substrate support and extending toward the substrate from the third reference position by a third movement amount so that distances of the first contact member, the second contact member and the third contact member from the center of the substrate support are kept equal with the substrate placed horizontally movably on the upper surface of the substrate support; (c) stopping the minute movements if sandwiching of the substrate by the first contact member, the second contact member and the third contact member is confirmed while the minute movements are repeated; and (d) adjusting a posture of the substrate placed on the upper surface of the substrate support before the operation (a) to the operation (c) are performed, wherein the operation (d) includes: (d-1) measuring a peripheral edge part of the substrate placed on the upper surface of the substrate support; (d-2) acquiring a direction of eccentricity of the center of the substrate from the center of the substrate support based on peripheral edge information on the peripheral edge part of the substrate; and (d-3) adjusting the posture of the substrate such that the direction of eccentricity is parallel to a virtual line extending through the center of the substrate support by rotating the substrate support.

A third aspect of the invention is a substrate processing apparatus. The apparatus includes: a substrate support having an upper surface configured to support a substrate in a horizontal posture; the above centering device; a suction unit configured to suck and hold the substrate on the substrate support by exhausting air between the substrate positioned by the centering device and the substrate support; a rotation driver configured to rotate the substrate support sucking and holding the substrate about a center of the substrate support; and a processing liquid supply mechanism configured to supply a processing liquid to a peripheral edge part of the substrate rotated about the center of the substrate support integrally with the substrate support.

In the invention thus configured, the substrate is surrounded by the first contact member located at the first reference position, the second contact member located at the second reference position and the third contact member located at the third reference position in the horizontal plane. These three contact members gradually approach the substrate while keeping the distances from the center of the substrate support equal by repeating the minute movements. In the invention, the substrate posture is so adjusted that the direction of eccentricity is parallel to the virtual line prior to the start of the movements of the contact members. That is, the eccentricity of the substrate in the horizontal plane has only a component parallel to the virtual line (corresponding to an X-direction component to be described later), and a horizontal component orthogonal to the direction of eccentricity (corresponding to a Y-direction component to be described later) is substantially zero. Thus, the contact members successively contact the substrate and push the substrate along the virtual line during approaching movements. That is, an entire pushing force is used to move the substrate in a direction opposite to the direction of eccentricity and the substrate can be positioned with a small force. Moreover, since the substrate does not move in the horizontal direction orthogonal to the direction of eccentricity during a positioning movement, a separation interval between the second contact member and the third contact member in this horizontal direction can be shortened. As a result, restrictions on the configuration of the moving mechanism, the arrangement of the second contact member and the third contact member and the like are reduced.

As described above, according to the invention, a centering operation of the substrate can be performed with an excellent degree of design freedom.

All of a plurality of constituent elements of each aspect of the invention described above are not essential and some of the plurality of constituent elements can be appropriately changed, deleted, replaced by other new constituent elements or have limited contents partially deleted in order to solve some or all of the aforementioned problems or to achieve some or all of effects described in this specification. Further, some or all of technical features included in one aspect of the invention described above can be combined with some or all of technical features included in another aspect of the invention described above to obtain one independent form of the invention in order to solve some or all of the aforementioned problems or to achieve some or all of the effects described in this specification.

DETAILED DESCRIPTION OF THE PREFERRED EMBODIMENTS

Figure 1:
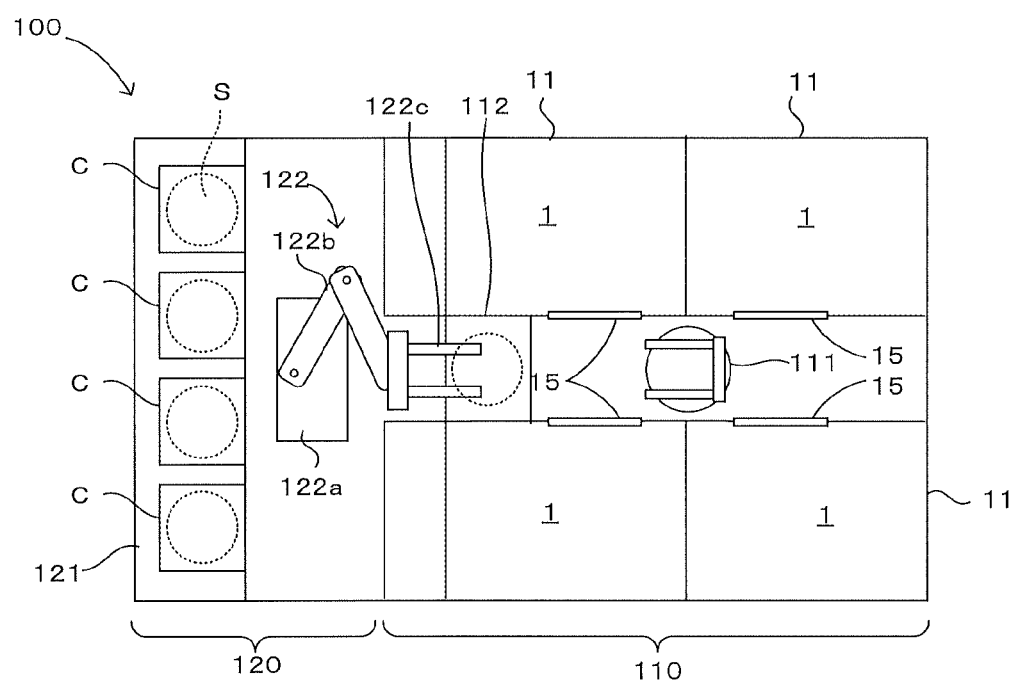
FIG. 1 is a plan view showing a schematic configuration of a first embodiment of a substrate processing apparatus according to the invention.

FIG. 1 is a plan view showing a schematic configuration of a first embodiment of a substrate processing apparatus according to the invention. This figure is a diagram not showing the external appearance of the apparatus, but showing an internal structure of a substrate processing system 100 by excluding an outer wall panel and other partial configurations. This substrate processing system 100 is, for example, a single-wafer type apparatus installed in a clean room and configured to process substrates W each having a circuit pattern (hereinafter, referred to as a "pattern") only on one principal surface one by one. A substrate processing with processing fluid is carried out in a processing unit 1 equipped in the substrate processing system 100. In this specification, a pattern formation surface (one principal surface) formed with the pattern is referred to as a "front surface" and the other principal surface not formed with the pattern on an opposite side is referred to as a "back surface". Further, a surface facing down is referred to as a "lower surface" and a surface facing up is referred to as an "upper surface". Further, in this specification, the "pattern formation surface" means a surface of the substrate where an uneven pattern is formed in an arbitrary region regardless of whether the surface is flat, curved or uneven.

Here, various substrates such as semiconductor wafers, glass substrates for photomask, glass substrates for liquid crystal display, glass substrates for plasma display, substrates for FPD (Flat Panel Display), optical disk substrates, magnetic disk substrates and magneto-optical disk substrates can be applied as the "substrate" in this embodiment. Although the substrate processing apparatus used in processing semiconductor wafers is mainly described as an example with reference to the drawings below, application to the processing of various substrates illustrated above is also possible.

As shown in FIG. 1, the substrate processing system 100 includes a substrate processing area 110 for processing the substrate S. An indexer station 120 is provided adjacent to this this substrate processing area 110. The indexer station 120 includes a container holder 121 capable of holding a plurality of containers C for housing the substrates W (FOUPs (Front Opening Unified Pods), SMIF (Standard Mechanical Interface) pods, OCs (Open Cassettes) for housing a plurality of the substrates W in a sealed state), and an indexer robot 122 for taking out an unprocessed substrate S from the container C by accessing the container C held by the container holder 121 and housing a processed substrate S in the container C. A plurality of the substrates W are housed substantially in a horizontal posture in each container C.

The indexer robot 122 includes a base 122a fixed to an apparatus housing, an articulated arm 122b provided rotatably about a vertical axis with respect to the base 122a, and a hand 122c mounted on the tip of the articulated arm 122b. The hand 122c is structured such that the substrate S can be placed and held on the upper surface thereof. Such an indexer robot including the articulated arm and the hand for holding the substrate is not described in detail since being known.

In the substrate processing area 110, a mounting table 112 is provided to place a substrate S from the indexer robot 122. Also, in a plan view, a substrate conveyor robot 111 is positioned almost in the center of the substrate processing area 110. Furthermore, a plurality of processing units 1 are arranged to surround this substrate conveyor robot 111. The substrate conveyor robot 111 randomly accesses these processing units 1 and transfers the substrates W. On the other hand, each processing unit 1 performs a predetermined processing to the substrate S. In this embodiment, these processing units 1 have the same function. Thus, a plurality of the substrates W can be processed in parallel. In the embodiment, one of the processing units 1 corresponds to the substrate processing apparatus 10 according to the invention.

Figure 2:
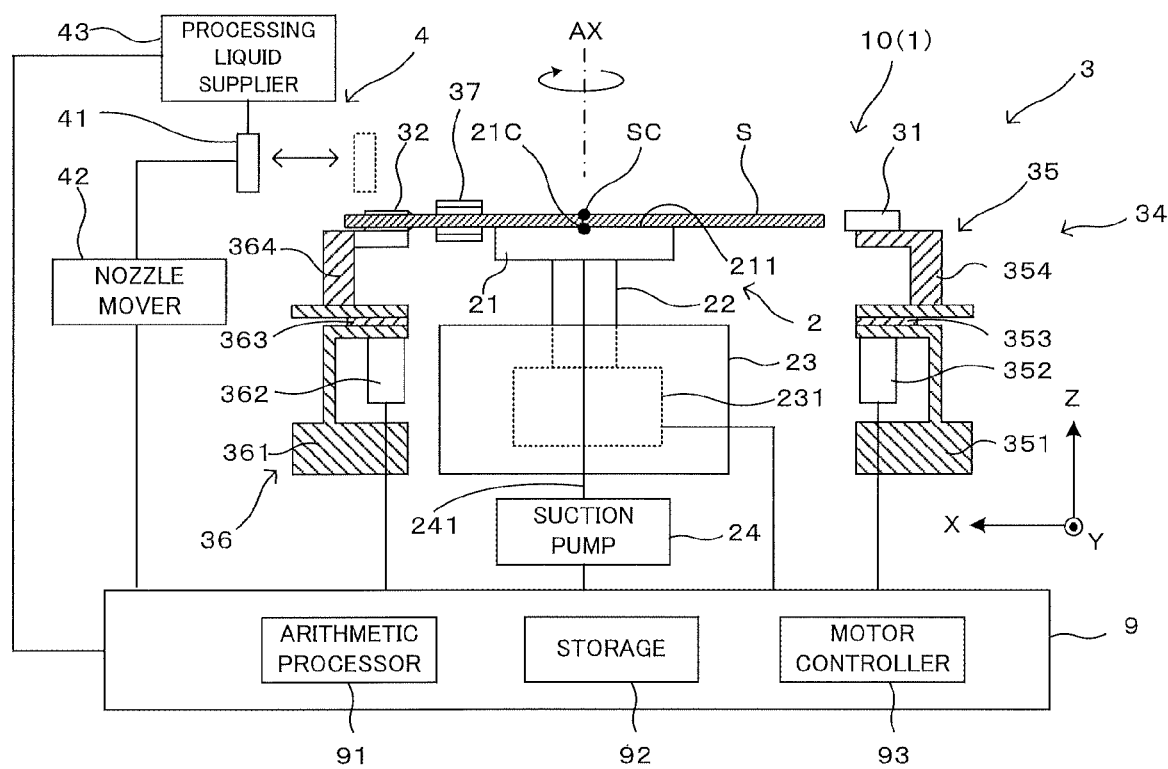
FIG. 2 briefly shows a configuration in a first embodiment of the substrate processing apparatus.
Figure 3:
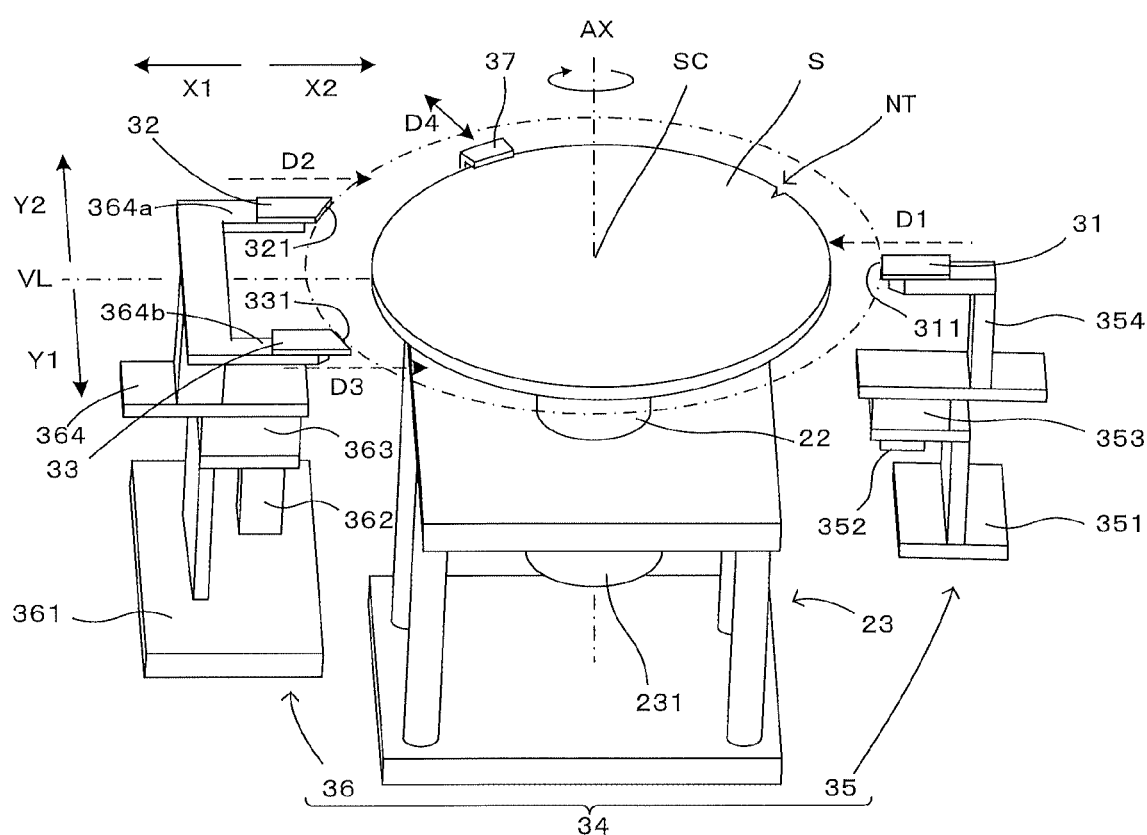
FIG. 3 is a perspective view showing the configurations of a substrate holder and a centering mechanism of the substrate processing apparatus.
Figure 4:
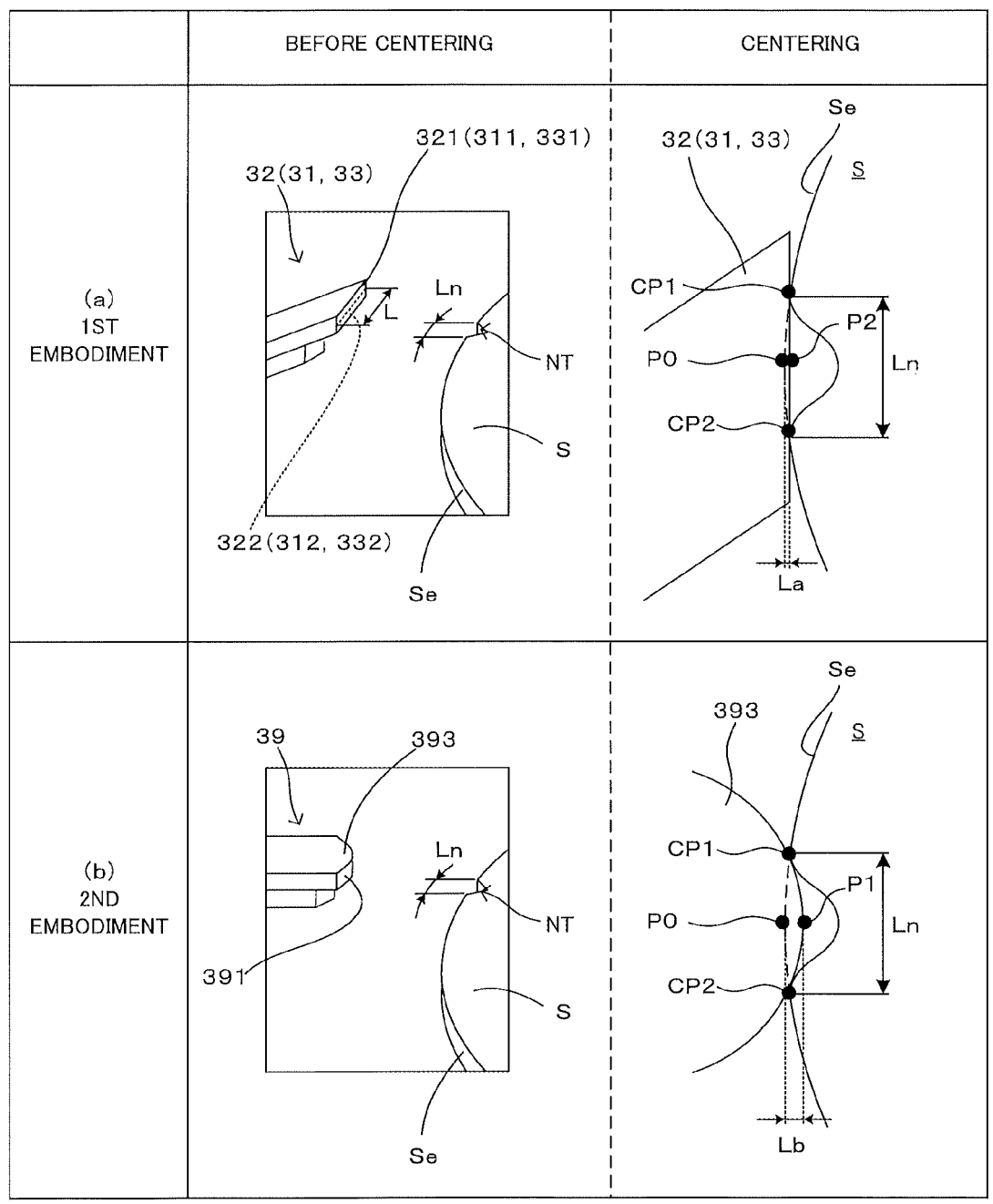
FIG. 4 is a diagram schematically showing the configuration of a contact member that can be employed in the centering mechanism and the relationship with the notch of the substrate.
Figure 5:
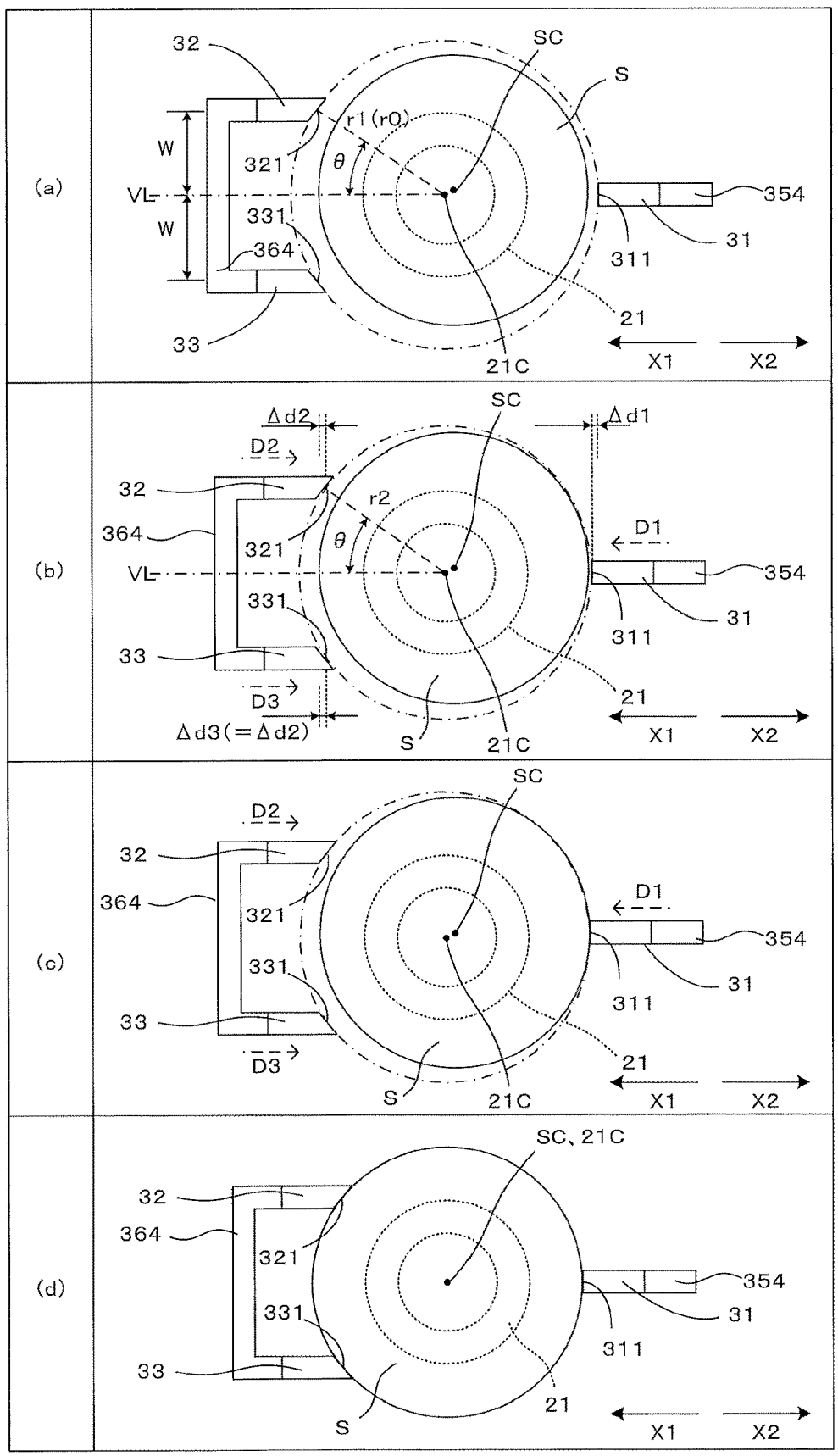
FIG. 5 is a diagram schematically showing the operation of the centering mechanism.
Figure 6:
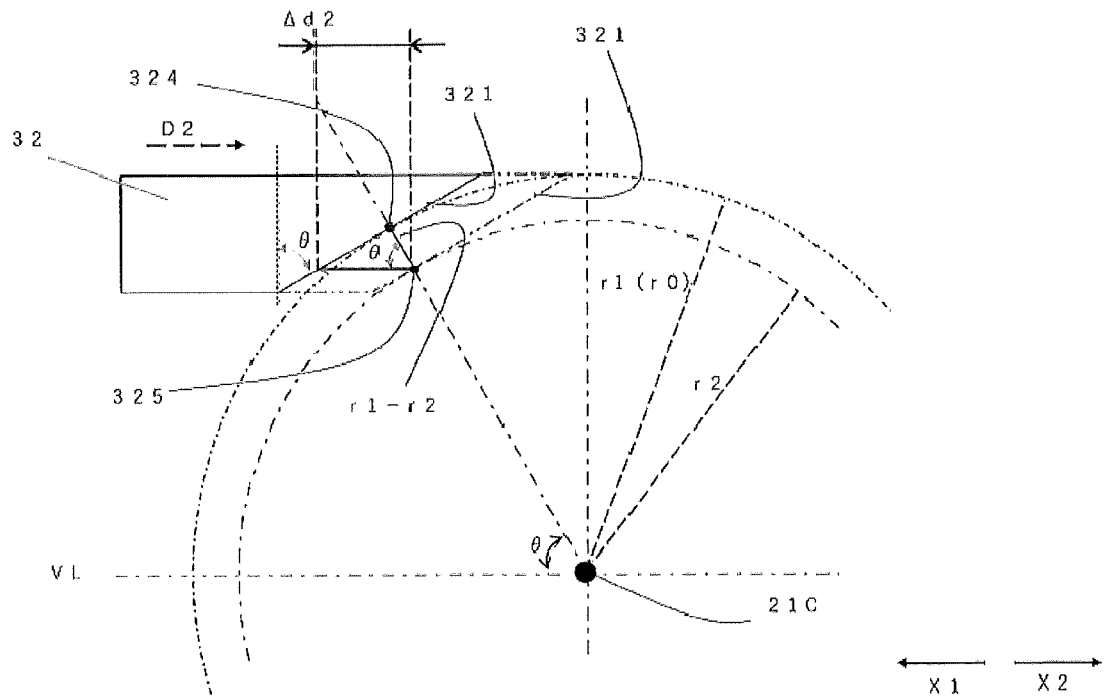
FIG. 6 is a diagram schematically showing the positional relationship between the contact member and the center of the spin base before and after the minute movement.

FIG. 2 briefly shows a configuration in a first embodiment of the substrate processing apparatus. FIG. 3 is a perspective view showing the configurations of a substrate holder and a centering mechanism of the substrate processing apparatus. FIG. 4 is a diagram schematically showing the configuration of a contact member that can be employed in the centering mechanism and the relationship with the notch of the substrate. FIG. 5 is a diagram schematically showing the operation of the centering mechanism. FIG. 6 is a diagram schematically showing the positional relationship between the contact member and the center of the spin base before and after the minute movement. The substrate processing apparatus 10 is an apparatus that performs a bevel etching process as an example of a "process" of the present invention, and supplies a processing liquid to a peripheral edge part of an upper surface of the substrate S in a processing chamber. For this purpose, the substrate processing apparatus 10 includes a substrate holder 2, a centering mechanism 3 forming a principal structure of a centering device according to the present invention, and a processing liquid supply mechanism 4. Operations of these structures are controlled by a controller 9 responsible for control over the apparatus entirely.

The substrate holder 2 includes a spin base 21 that is a member of a smaller circular plate shape than the substrate S. The spin base 21 is supported on a rotary support shaft 22 extending downward from a central part of a lower surface of the spin base 21 in such a manner as to locate an upper surface 211 of the spin base 21 horizontally. The rotary support shaft 22 is rotatably supported by a rotary driver 23. The rotary driver 23 includes a built-in rotary motor 231. The rotary motor 231 rotates in response to a control command from the controller 9. In response to receipt of resultant rotary driving force, the spin base 21 rotates about a vertical axis AX (alternate long and short dashed lines) extending in a vertical direction while passing through a center 21C of the spin base 21. In FIG. 2, a top-bottom direction corresponds to the vertical direction. A plane perpendicular to the plane of paper of FIG. 2 is a horizontal plane. To clearly show a relationship in terms of direction, a coordinate system defining a Z axis as the vertical direction and an XY plane as the horizontal plane is given in FIG. 2 and its subsequent drawings, if appropriate.

The upper surface 211 of the spin base 21 has a dimension by which the substrate S is supportable to allow the substrate S to be placed on the upper surface 211 of the spin base 21. Although not shown in the drawings, the upper surface 211 is provided with a plurality of suction holes or suction grooves, for example. Such suction holes or grooves are connected to a suction pump 24 through a suction pipe 241. This suction pump 24 serves as an example of the "suction unit" of the invention. In response to a control command from the controller 9, the suction pump 24 operates to apply suction power from the suction pump 24 to the spin base 21. As a result, air is exhausted from between the upper surface 211 of the spin base 21 and a lower surface of the substrate S, thereby holding the substrate S under suction on the spin base 21. Together with the rotation of the spin base 21, the substrate S held under suction in this way rotates about the vertical axis AX. Hence, the occurrence of misalignment between a center SC of the substrate S and the center 21C of the spin base 21, namely, decentering of the substrate S reduces the quality of the bevel etching process Accordingly, in this embodiment, the centering mechanism 3 is provided and functions as a "centering device" according to the invention by cooperating with the controller 9. The centering mechanism 3 includes a meter 37 for measuring a peripheral edge part of the substrate S sucked and held on the spin base 21. This meter 37 can be located on the peripheral edge part of the substrate S sucked and held on the spin base 21 as shown in FIG. 3 and obtain peripheral edge information on the peripheral edge part of the substrate S. Further, in a radial direction D4 of the spin base 21, the meter 37 can move to a retracted position separated from the peripheral edge part of the substrate S. An edge detection sensor described in JP 2021-54562A can be, for example, used as the meter 37. More specifically, the meter 37 detects an edge position of the substrate S in the radial direction of the spin base 21 while the substrate S is making at least one turn about the vertical axis AX together with the rotation of the spin base 21, and outputs an edge detection signal representing this edge position as the peripheral edge information to the controller 9. Accordingly, a direction of eccentricity (D5 in FIG. 8 to be described later) in which a center SC of the substrate S is eccentric from the center 21C of the spin base 21, an amount of eccentricity and a relative position of the notch NT with respect to the direction of eccentricity can be obtained by analyzing this edge detection signal. Note that, besides the edge detection sensor, an imager for imaging the peripheral edge part of the substrate S may be used as the meter 37. In this case, a continuous image captured by the imager while the substrate S is making at least one turn about the vertical axis AX together with the rotation of the spin base 21 is equivalent to the peripheral edge information. Since methods for deriving the direction of eccentricity, the amount of eccentricity and the notch position based on the edge detection signal or the continuous image of the peripheral edge part in this way are known, these methods are not described in detail.

The spin base 21 rotates by an angle corresponding to the direction of eccentricity obtained in this way while sucking and holding the substrate S. In this way, the posture of the substrate S is so adjusted that the direction of eccentricity is aligned with a virtual line to be described later. Subsequent to that, the suction by the suction pump 24 is stopped, i.e. the substrate S becomes horizontally movable on the upper surface 211 of the spin base 21. In this state, the centering operation is performed. The above eccentricity is solved by this centering operation, and the center SC of the substrate S is aligned with the center 21C of the spin base 21. Note that the detailed configuration and operation of the centering mechanism 3 including the above posture adjustment are described later.

The processing liquid supply mechanism 4 is provided to perform the bevel etching process on the substrate S after implementation of the centering operation on the substrate S. The processing liquid supply mechanism 4 includes a processing liquid nozzle 41, a nozzle mover 42 that moves the processing liquid nozzle 41, and a processing liquid supplier 43 that supplies a processing liquid to the processing liquid nozzle 41. The nozzle mover 42 moves the processing liquid nozzle 41 between a retreat position to which the processing liquid nozzle 41 retreats laterally from a position above the substrate S as indicated by solid lines in FIG. 2 and a processing position above a peripheral edge part of the substrate S as indicated by dotted lines in FIG. 2.

The processing liquid nozzle 41 is connected to the processing liquid supplier 43. When a suitable processing liquid is supplied from the processing liquid supplier 43 to the processing liquid nozzle 41 located at the processing position, the processing liquid is ejected from the processing liquid nozzle 41 onto a peripheral edge part of the rotating substrate S. By doing so, the bevel etching process with the processing liquid is performed on the entire peripheral edge part of the substrate S.

Although not shown in FIG. 2, a splash guard is provided in such a manner as to surround the substrate holder 2 from the side. The splash guard collects droplets of a processing liquid blown off from the substrate S during implementation of the bevel etching process to effectively prevent the collected droplets from flying around the apparatus. The configuration of the centering mechanism 3 will be described next by referring to FIGS. 2 to 6. The centering mechanism 3 has the function of determining the position of the substrate S by moving the substrate S horizontally on the upper surface 211 of the spin base 21 in such a manner as to align the center SC of the substrate S placed on the upper surface 211 of the spin base 21 with the center 21C of the spin base 21. As shown in FIG. 3, as viewed in the X direction, the centering mechanism 3 includes a contact member 31 arranged closer to an X2 direction (right-hand direction in FIG. 3) and a contact member 32 and a contact member 33 arranged closer to an X1 direction (left-hand direction in FIG. 3) with respect to the center 21C of the spin base 21. The centering mechanism 3 further includes a moving mechanism 34 for moving the contact members 31 to 33 in a horizontal direction.

The moving mechanism 34 includes a single mover 35 for moving the contact member 31, and a multi-mover 36 for moving the contact members 32 and 33 collectively. The single mover 35 is arranged closer to the X2 direction and the multi-mover 36 is arranged closer to the X1 direction with respect to the center 21C of the spin base 21.

The single mover 35 includes a fixed base 351, a rotary motor 352, a power transmitter 353, and a slider 354. The rotary motor 352 is mounted on the fixed base 351, and the power transmitter 353 and the slider 354 are stacked in this order over the fixed base 351. The rotary motor 352 is a driving source for moving the contact member 31 in the X direction. When the rotary motor 352 operates in response to a control command from the controller 9, a rotary shaft (not shown in the drawings) rotates. This rotary shaft extends from the top of the fixed base 351 to the power transmitter 353 and rotary driving force generated by the rotary motor 352 is transmitted to the power transmitter 353. Using a rack-and-pinion structure, for example, the power transmitter 353 converts rotary motion responsive to the rotary driving force to liner motion in the X direction, and transmits the linear motion to the slider 354. This makes the slider 354 move back and forth in the X direction by a distance responsive to the amount of the rotation. As a result, in response to the movement of the slider 354, the contact member 31 mounted on the top of the slider 354 is moved in the X direction.

The multi-mover 36 has a configuration basically the same as that of the single mover 35 except that a slider 364 has a partially different structure. Specifically, the multi-mover 36 applies rotary driving force generated by a rotary motor 362 mounted on a fixed base 361 to the slider 364 using a power transmitter 363, thereby moving the slider 364 in the X direction. The slider 364 has a top including two arms 364a and 364b extending in the X2 direction and separated from each other in a Y direction. The top of the slider 364 has a substantially C-shape in a plan view from vertically above. The contact members 32 and 33 are mounted on end portions closer to the X2 direction of the arms 364a and 364b respectively. Thus, when the rotary motor 362 operates in response to a control command from the controller 9, the slider 364 moves back and forth in the X direction by a distance responsive to the amount of the rotation of the rotary motor 362, like in the single mover 35. As a result, in response to the movement of the slider 364, the contact members 32 and 33 mounted on the slider 364 are moved in the X direction.

The contact members 31 to 33 have contact surfaces 311 to 331 capable of contacting the end face Se of the substrate S, respectively. With these contact surfaces 311 to 331 directed toward the end face Se of the substrate S, the contact members 31 to 33 are arranged so as to surround the substrate holder 2 in the XY plane (horizontal plane). The contact surfaces 311 to 331 have a planar shape, and their surface normals face the vertical axis AX. For example, as shown in section (a) of FIG. 4, on the contact surface 321, a linear region 322 that intersects a virtual horizontal plane including the substrate S placed on the upper surface of the substrate holder 2 functions as a "contactable region" of the present invention. Its length L is longer than the length Ln of the arc along which the circumference of the substrate S is cut off by the notch NT. Therefore, when the contact member 32 is moved toward the end face Se of the substrate S during centering, it contacts the end face Se of the substrate S at one or two points in the linear region 322. That is, as shown in FIG. 4, when the substrate S is placed on the upper surface of the spin base 21 with the notch NT facing the contact surface 321, the two contact points CP1 and CP2 on the linear region 322 contact on the end face Se of the substrate S. On the other hand, in other areas, one contact point on the linear region 322 contacts the end face Se of the substrate S. The same applies to the contact surfaces 311 and 331 as well. The reason why the contact members 31 to 33 are configured as described above will be described later in detail with reference to FIG. 4.

When the contact member 31 is moved in the X1 direction by the single mover 35, a contact surface 311 of the contact member 31 goes toward the center 21C of the spin base 21 to contact on the end face Se of the substrate S. As described above, in the present embodiment, a D1 direction in which the contact member 31 moves for abutting on the substrate S is the X1 direction, and this direction corresponds to a "first horizontal direction" of the present invention. After making the abutting contact, the contact member 31 moves further in the D1 direction, thereby moving the substrate S horizontally on the upper surface 211 of the spin base 21 in the X1 direction while pressing the substrate S in the X1 direction. In the present embodiment, to facilitate understanding of the substance of the invention, a virtual line VL extended in the X1 direction from the center 21C of the spin base 21 is additionally illustrated in FIGS. 3, 5 and 6. This line corresponds to a "virtual line" of the present invention. The configuration of the centering mechanism 3 will be described continuously using the virtual line VL in appropriate cases.

A configuration in which the contact members 32 and 33 are moved by the multi-mover 36 partially differs from that of the contact member 31. The reason for this is that the contact members 32 and 33 are arranged line-symmetrically to each other with respect to the virtual line VL in the horizontal plane and are moved in the X direction while being kept in this arrangement state. More specifically, as shown in a section (a) of FIG. 5, the contact member 32 is arranged at a position deviating from the virtual line VL by a predetermined distance W (shorter than a radius rs of the substrate S) to be closer to a Y2 direction. Meanwhile, the contact member 33 is arranged at a position deviating by the same distance W as the contact member 32 from the virtual line VL to be closer to the opposite side of the contact member 32 with respect to the virtual line VL, specifically, to be closer to a Y1 direction. Thus, when the contact members 32 and 33 are moved in the X2 direction by the multi-mover 36, a contact surface 321 of the contact member 32 contacts on the end face at a position closer to the Y2 direction than the virtual line VL. Furthermore, a contact surface 331 of the contact member 33 contacts on the end face at a position closer to the Y1 direction than the virtual line VL. As described above, in the present embodiment, a D2 direction in which the contact member 32 moves for abutting on the substrate S is the X2 direction, and this direction corresponds to a "second horizontal direction" of the present invention. A D3 direction in which the contact member 33 moves for abutting on the substrate S is also the X2 direction, and this direction corresponds to a "third horizontal direction" of the present invention. Thus, in order to move the contact surfaces 311, 321, and 331 while distances from the center 21C of the spin base 21 to the contact surfaces 311, 321, and 331 are kept equally, a movement amount per unit time is required to differ between the contact member 31 and the contact members 32, 33. This will be described in detail by referring to FIGS. 5 and 6, and the centering operation using the above-described configuration of movement will also be described.

To place the substrate S on the upper surface 211 of the spin base 21, the contact surfaces 311, 321 and 331 are desirably positioned at reference positions at least in consideration of a maximum value of an outer diameter tolerance of the substrate S. For example, in the substrate S having a diameter of 300 mm, the outer diameter tolerance is 0.2 mm. Accordingly, the contact surfaces 311, 321 and 331 need to be separated from the center 21C of the spin base 21 by a distance of 150.1 mm or more. This distance is referred to as a "reference distance r0" in this embodiment and, as shown in field (a) of FIG. 5, a circle (one-dot chain line) having a radius centered on the center 21C of the spin base 21 and equal to the reference distance r0 is a reference circle.

Next, a case is studied where the contact surfaces 311, 321 and 331 are moved toward the substrate S after the contact members 31 to 33 are so positioned that the contact surfaces 311, 321 and 331 are located on the reference circle. In this case, the position of the contact member 31 for positioning the contact surface 311 on the reference circle corresponds to a "first reference position" of the invention, the position of the contact member 32 for positioning the contact surface 321 on the reference circle corresponds to a "second reference position" of the invention, and the position of the contact member 33 for positioning the contact surface 331 on the reference circle corresponds to a "third reference position" of the invention.

Here, a case is studied next, where the contact members 31 to 33 are located at the first reference position, the second reference position, and the third reference position respectively, the contact member 31 makes a tiny movement by a first movement amount Δd1 in the D1 direction (X1 direction) toward the substrate S. If each of the contact members 32 and 33 makes a tiny movement by the same distance in the D2 direction (X2 direction) in response to the movement of the contact member 31, the contact surfaces 311, 321, and 331 are separated by nonuniform distances from the center 21C of the spin base 21. Hence, repeating the tiny movements of the contact members 31 to 33 while keeping a uniform movement amount per unit time results in the failure to align the center SC of the substrate S with the center 21C of the spin base 21.

In contrast, as shown in field (b) of FIG. 5 and FIG. 6, the contact surfaces 311, 321 and 331 can be moved while keeping the distances from the center 21C of the spin base 21 to the respective contact surfaces 311, 321 and 331 equal by finely moving the contact member 32 in the D2 direction by a second movement amount Δd2 and finely moving the contact member 33 in the D3 direction by a third movement amount Δd3 to correspond to a fine movement of the contact member 31 in the D1 direction by a first movement amount Δd1.

FIG. 6 is a diagram schematically showing positional relationships between the contact member 32 and the center 21C of the spin base 21 before and after the fine movement. FIG. 6 shows a positional relationship between a circle centered on the center 21C of the spin base 21 and having a radius r1 and the contact member 32 and a positional relationship between a circle centered on the center 21C of the spin base 21 and having a radius r2 and the contact member 32. In FIG. 6, the contact member 32 before the fine movement of the contact member 32 in the D2 direction by the second movement amount Δd2 is shown by a solid line and the contact member 32 after the fine movement is shown by a two-dot chain line. FIG. 6 shows a contact point 324 between the circle centered on the center 21C of the spin base 21 and having the radius r1 and the contact member 32 and a contact point 325 between the circle centered on the center 21C of the spin base 21 and having the radius r2 and the contact member 32.

As shown in FIG. 6, the contact points 324 and 325 are at different positions on the contact member 32. On the other hand, a straight line connecting the center 21C of the spin base 21 and the contact point 324 and a straight line connecting the center 21C of the spin base 21 and the contact point 325 overlap. Further, an angle between the straight line connecting the center 21C of the spin base 21 and the contact point 324 and a virtual line VL and an angle between the straight line connecting the center 21C of the spin base 21 and the contact point 325 and the virtual line VL are equal.

Thus, a fine moving distance Δd2 (corresponding to a "second movement amount" of the invention) of the contact member 32 and a fine moving distance Δd3 (corresponding to a "third movement amount" of the invention) of the contact member 33 can be set as follows:

$$\Delta d2 = \Delta d3 = (r1 - r2)/\cos\theta = \Delta d1/\cos\theta,$$

$$r_1 = r0, \text{ and}$$

$$r2 = r1 - \Delta d1,$$

where:
- r1: distance from the center 21C to the contact surface 321 before the fine movement,
- θ: angle between the straight lines connecting the center 21C of the spin base 21 and the contact points 324, 325 and the virtual line,
- r2: distance from the center 21C to the contact surface 321 after the fine movement, and
- W: separation distance of the contact member 32 from the virtual line VL.

In this case, even after the fine movement, the distances from the center 21C of the spin base 21 to the contact surfaces 311, 321 and 331 are equal. By repeating such fine movements, the contact members 31 to 33 approach the substrate S while keeping the distances from the center 21C of the spin base 21 to the contact surfaces 311, 321 and 331 equal. Then, for example, if there is a deviation as shown in FIG. 5, the contact member 31 first contacts the substrate S and moves the substrate S in the D1 direction while the above fine movements are repeated (see field (c) of FIG. 5). Subsequent to that, the contact member 32 contacts the substrate S pushed by the contact member 31 and horizontally moves the substrate S. Then, if the distances from the center 21C of the spin base 21 to the contact surfaces 311, 321 and 331 become the radius of the substrate S as shown in field (d) of FIG. 5, the last contact member 33 also contacts the substrate S. In this way, the substrate S is sandwiched by the contact members 31 to 33 to stop a movement thereof, and the center SC of the substrate S is aligned with the center 21C of the spin base 21. In this way, the centering process of the substrate S can be performed.

In the present embodiment including the centering mechanism 3, the controller 9 controls each part of the substrate processing apparatus 10 to perform the centering operation described above and the subsequent bevel etching process. The controller 9 includes an arithmetic processor 91 composed of a computer with a central processing unit (CPU), a random access memory (RAM), etc., a storage 92 such as a hard disk drive, and a motor controller 93.

Figure 7:
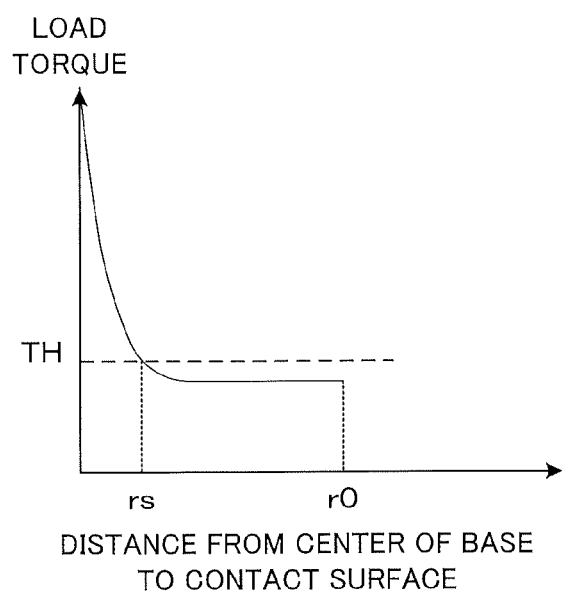
FIG. 7 is a graph showing variations in load torque with respect to variations in a distance from a center of a base to a contact surface in the first embodiment.

The arithmetic processor 91 reads a centering program and a bevel etching program as appropriate stored in advance in the storage 92, develops the program in the RAM (not shown in the drawings), and performs the centering operation and the bevel etching process shown in FIG. 5. In particular, in performing the centering operation, the arithmetic processor 91 calculates the first movement amount Δd1 to the third movement amount Δd3, and controls the rotary motors 352 and 362 of the moving mechanism 34 through the motor controller 93 on the basis of the calculated movement amounts Δd1 to Δd3. Furthermore, the arithmetic processor 91 calculates a load torque at the single mover 35 on the basis of a motor current value applied to the rotary motor 352 and calculates a load torque at the multi-mover 36 on the basis of a motor current value applied to the rotary motor 362. In response to change in a distance from the center 21C of the spin base 21 to each of the contact surfaces 311, 321, and 331 (a distance from the base center to the contact surface) occurring while the tiny movements are repeated, the load torque varies in a manner shown in FIG. 7, for example. As shown in FIG. 7, at a time when this distance conforms to the radius rs of the substrate S, specifically, when the substrate S is nipped with the contact members 31 to 33, the load torques increase steeply at the single mover 35 and the multi-mover 36 nearly simultaneously. At a time when the load torque exceeds a threshold, the arithmetic processor 91 determines that the centering operation is completed and stops the movements of the contact members 31 to 33. In the present embodiment, variation in the load torque at each of the motors 352 and 362 is monitored. Alternatively, only one of the motors may be monitored to determine timing of stopping movements of the contact members 31 to 33. Additionally, the load torque may certainly be calculated on the basis of an element other than the motor current value. These points also apply to a case where each of the contact members 31 to 33 is moved by a dedicated motor. Further, in the case of moving the contact members 31 to 33 by a single motor, calculation may be made based on a load torque and a motor current value of this motor.

To satisfactorily perform the centering operation shown in FIGS. 5 and 6, the position accuracy of the substrate S in advancing directions (X direction) of the contact members 31 to 33 and a horizontal direction (Y direction) orthogonal to the advancing directions needs to be enhanced. Particularly, to enhance the position accuracy of the substrate S in the Y direction, an approach of widening an interval between the contact members 32 and 33 in the Y direction is considered. However, with this approach, an increase in device size is unavoidable and interference with other devices becomes problematic. Further, the rotation motor 362 of a high output needs to be used as a drive source for driving the contact members 32, 33. As a result, a problem of largely restricting a degree of design freedom of the centering mechanism 3 newly arises.

Figure 8:
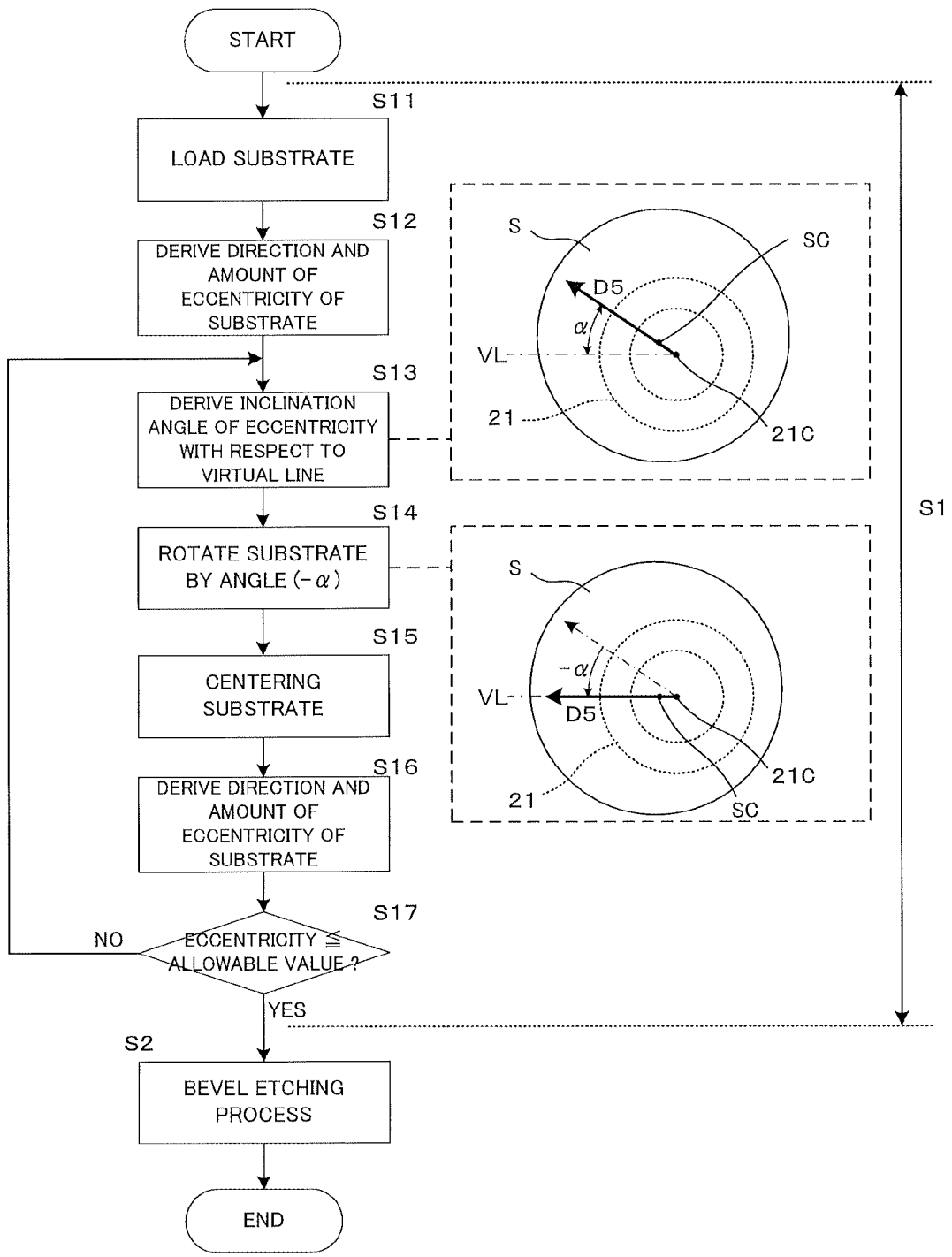
FIG. 8 is a flow chart showing the operation of the substrate processing apparatus shown in FIG. 2.

Accordingly, in this embodiment, a direction of eccentricity is obtained and the posture of the substrate S is adjusted before the contact members 31 to 33 shown in FIG. 5 are moved. The centering operation including these direction of eccentricity acquisition and substrate posture adjustment is performed by the arithmetic processor 91 controlling each component of the device in accordance with the centering program. A bevel etching process is performed after this centering operation. As just described, in this embodiment, the arithmetic processor 91 functions as an eccentricity information acquirer for acquiring eccentricity information including the direction of eccentricity, a substrate posture adjuster for adjusting the posture of the substrate S and a movement controller for positioning the substrate S by repeating the minute movements until the contact of all the contact members 31 to 33 with the substrate S is completed as shown in FIG. 8. The operation of the substrate processing apparatus 10 equipped with the centering device according to the first embodiment is described below with reference to FIG. 8.

FIG. 8 is a flow chart showing the operation of the substrate processing apparatus shown in FIG. 2. In the substrate processing apparatus 10, the arithmetic processor 91 performs the centering operation (Step S1) by controlling each component of the device before the bevel etching process (Step S2). More specifically, the following Steps S11 to S17 are performed.

The arithmetic processor 91 causes the motor controller 93 to move the contact members 31 to 33 and the meter 37 to positions radially separated from the spin base 21. In this way, a conveyance space sufficient for the entrance of a hand (not shown) of the substrate conveyance robot 111 can be formed above the spin base 21 and the substrate S conveyed by the substrate conveyance robot 111 can be prevented from interfering with the contact members 31 to 33 and the meter 37.

If the formation completion of the conveyance space and the prevention of interference with the substrate S are confirmed in this way, the arithmetic processor 91 requests the substrate conveyance robot 111 to load the substrate S and waits until an unprocessed substrate S is carried into the substrate processing apparatus 10 and placed on the upper surface of the spin base 21. Then, the substrate S is placed on the spin base 21 (Step S11). At this point of time, the suction pump 24 is stopped and the substrate S can horizontally move on the upper surface of the spin base 21.

When the loading of the substrate S is completed, the substrate conveyance robot 111 is retracted from the substrate processing apparatus 10. Subsequent to that, the arithmetic processor 91 sucks and holds the substrate S on the spin base 21 by the operation of the suction pump 24. Further, the arithmetic processor 91 moves the meter 37 from the retracted position to a peripheral edge part of the substrate S along the radial direction D4. Thereafter, the arithmetic processor 91 causes the spin base 21 to make at least one turn about the vertical axis AX via the motor controller 93. In this way, the substrate S stops rotating after rotating together with the spin base 21. During this rotation, the arithmetic processor 91 receives an edge detection signal output from the meter 37 as the peripheral edge information, and derives a direction of eccentricity D5 and an amount of eccentricity of the center SC of the substrate S from the center 21C of the spin base 21 and the relative position of the notch NT (see FIG. 3) (Step S12). Here, the relative position of the notch NT means the relative position of the notch NT with respect to the direction of eccentricity D5. Note that, in the first embodiment and second and third embodiments to be described later, information on the relative position of the notch NT (corresponding to an example of "cut position information" of the invention) is not used. Therefore, the acquisition of the cut position information is not essential in these embodiments.

Subsequently, the arithmetic processor 91 derives an angle of inclination a of the direction of eccentricity D5 with respect to the virtual line VL (Step S13). Subsequent to that, the motor controller 93 rotates the spin base 21 by an angle (−a) about the vertical axis AX (Step S14). In this way, the direction of eccentricity D5 of the substrate S becomes parallel to the virtual line VL, is oriented in the X1 direction and overlaps the virtual line VL. That is, the eccentricity of the substrate S in a horizontal plane has only an X1-direction component, and a Y-direction component is substantially zero. After such an adjustment of the substrate posture, the arithmetic processor 91 causes the contact members 31 to 33 to move toward the substrate S from a state where the contact members 31 to 33 are respectively located at the first, second and third reference positions as shown in FIG. 5. By repeating these minute movements, the substrate S is moved in the X2 direction by the amount of eccentricity derived in Step S12. As a result, the center SC of the substrate S is aligned with the center S21C of the spin base 21 (Step S15).

Although the centering operation may be completed by performing this Step S15 only once, the direction of eccentricity and the like of the substrate S are acquired again as in Step S12 (Step S16) for more accurate positioning. When the amount of eccentricity acquired again is higher than an allowable value set in advance ("NO" in Step S17), the arithmetic processor 91 returns to Step S13 and repeats Steps S13 to S17.

On the other hand, when "YES" in Step S17, i.e. when the amount of eccentricity acquired again is equal to or less than the allowable value set in advance, the arithmetic processor 91 transitions to the bevel etching process (Step S2) after causing the motor controller 93 to move the contact members 31 to 33 and the meter 37 to the positions radially separated from the spin base 21.

In the bevel etching process, the arithmetic processor 91 causes the motor controller 93 to rotate the substrate S about the vertical axis AX with the center SC of the substrate S aligned with the center 21C of the spin base 21. Then, the arithmetic processor 91 supplies the processing liquid to the processing liquid nozzle 41 by controlling the processing liquid supplier 43 while the substrate S is rotated, for example, at 1800 rpm. In this way, the processing liquid is discharged to the peripheral edge part of the rotating substrate S from the processing liquid nozzle 41. As a result, the bevel etching process by the processing liquid is performed for the entire peripheral edge part of the substrate S.

When detecting the elapse of a processing time required for the bevel etching process of the substrate S or the like, the arithmetic processor 91 gives a supply stop command to the processing liquid supplier 43 to stop the discharge of the processing liquid. Further, the arithmetic processor 91 stops the rotation of the spin base 21. In this way, the bevel etching process is completed and the arithmetic processor 91 unloads the substrate S from the substrate processing apparatus 10 in a procedure opposite to the loading process of the substrate S.

As described above, according to the first embodiment, the substrate posture is so adjusted that the direction of eccentricity D5 becomes parallel to the virtual line VL prior to the centering operation of the substrate S (Step S15). Thus, the eccentricity of the substrate S in the horizontal plane has only the X-direction component parallel to the virtual line VL, and the Y-direction component orthogonal to the direction of eccentricity D5 is substantially zero. Accordingly, the contact members 31 to 33 contacting the substrate S in the centering operation of the substrate S (Step S15) push the substrate S along the virtual line VL. That is, an entire pushing force is used to move the substrate S in a direction opposite to the direction of eccentricity D5. Therefore, the substrate S can be positioned with a small force. The rotation motors 352, 362 serving as drive sources of the moving mechanism 34 can be reduced in size.

Further, the eccentricity correction of the substrate S by moving the substrate S in the Y direction orthogonal to the direction of eccentricity D5 is not necessary in the centering operation. This means that a movement of the substrate S in the Y direction by the contact members 32, 33 is not necessary, and a separation interval between the second and third contact members 32, 33 in this Y direction can be reduced. Thus, the substrate processing apparatus 10 equipped with this centering mechanism 3 can be reduced in size. As just described, according to this embodiment, restrictions on the arrangement of the moving mechanism 34 and the contact members and the like are reduced and the centering device can be designed with a high degree of freedom.

Further, the following advantage is given by eliminating a need for correction in the Y direction by the contact members 32, 33. That is, after contacting the substrate S, the contact members 31 to 33 push the substrate S with a contact state maintained. Accordingly, slipping does not occur between the contact members 31 to 33 and the substrate S and the wear of the contact members 31 to 33 can be suppressed. As a result, exchange frequencies of the contact members 31 to 33 can be reduced due to long lives of the contact members 31 to 33 and the burden of an operator and running cost can be reduced.

The completion of the centering operation is determined on the basis of variation in the load torque and the movements of the contact members 31 to 33 are stopped immediately. This makes it possible to finish the centering operation at appropriate time without damaging the substrate S.

Further, since the contact members 31 to 33 have linear regions 312, 322 and 332 formed to intersect the XY plane as shown in field (a) of FIG. 4, other functions and effects are also obtained. This point is described with reference to FIG. 4.

To push and move the end surface Se of the substrate S in the horizontal direction, contact members including tip parts finished into a semi-disk shape as shown in field (b) of FIG. 4 (second embodiment) or tip parts finished into a sharp shape or contact members having a roller shape may be used. Also in the case of using these contact members, functions and effects similar to those of the above first embodiment are obtained.

However, for example, in the second embodiment shown in field (b) of FIG. 4, a tip part 393 of a contact member 39 has a semi-disk shape. In this contact member 39, a contact surface 391 facing the end face Se of the substrate S is finished into a convex shape toward the substrate S. Accordingly, on the contact surface 391, a curved region 392 intersecting a virtual horizontal plane including the substrate S placed on the upper surface of the substrate holder 2 has a curved shape having a center of curvature located on the side of the contact member 39. Thus, if the substrate S is placed on the upper surface of the spin base 21 with the notch NT facing the contact surface 391, a part of the tip part 393 is in contact with the substrate S at two contact points CP1, CP2 on the curved region 392 while entering the notch NT. As a result, at the time of centering, the contact surface 391 moves to a position P1 closer to the substrate S by the amount of eccentricity Lb than a position P0 where the contact surface 391 is positioned in contact with the end face Se of the substrate S. As a result, a pushing position of the contact member 39 deviates from a position for a precise centering process. For example, if the centering process was performed with the contact members 31 to 33 replaced by the contact members 39 in the centering mechanism 3 shown in FIG. 3, the following experimental result was obtained. Here, if the centering process was performed with the substrate (semiconductor wafer having a radius of 150 mm) placed on the spin base 21 rotated by a suitable rotation angle (e.g. 32°, 180° or 328°) about the vertical axis AX and the notch NT facing the contact surface 391, a deviation amount of the pushing position, i.e. the amount of eccentricity reached up to 240 μm.

In contrast, in the first embodiment, the contact surfaces 311 to 331 of the contact members 31 to 33 have a flat surface shape. Thus, as shown in field (a) of FIG. 4, a region (corresponding to an example of a "contactable region" of the invention) intersecting the virtual plane including the substrate S placed on the upper surface of the substrate holder 2 has a linear shape in each of the contact surfaces 311 to 331. Moreover, any of these linear regions 312, 322 and 332 is longer than an arc length Ln. Accordingly, if the substrate S is placed on the upper surface of the spin base 21 with the notch NT facing the contact surface 321 as shown in FIG. 4, two contact points CP1, CP2 on the linear region 322 are locked by shoulder parts of the notch NT, which can effectively prevent a part of the contact member 32 from entering the notch NT. Further, the contact surface 321 moves to a position P2 closer to the substrate S by an eccentric deviation amount La than a position P0 where the contact surface 321 is positioned in contact with the end face Se of the substrate S, but the amount of eccentricity La is drastically smaller than the amount of eccentricity Lb in the comparative example.

A combination of the centering mechanism 3 and the controller 9 corresponds to the first embodiment of the centering device according to the invention, but the configurations of the contact surfaces 311, 321 and 331 in the centering mechanism 3 are not limited to this. For example, the contact surfaces 311, 321 and 331 may be finished such that contactable regions intersecting the XY plane are curved as shown in FIG. 9 (third embodiment).

Figure 9:
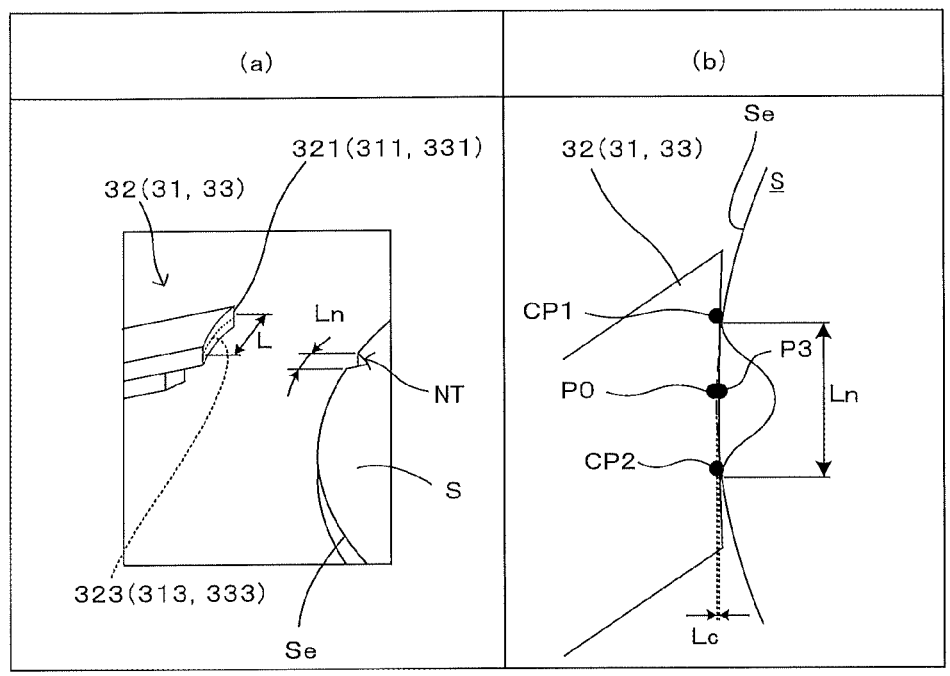
FIG. 9 is a diagram schematically showing the configuration of a contact member adopted in the third embodiment of the centering device according to the invention and a relationship with a notch of a substrate.

FIG. 9 is a diagram schematically showing the configuration of a contact member adopted in the third embodiment of the centering device according to the invention and a relationship with a notch of a substrate. This third embodiment largely differs from the first embodiment in that contact surfaces 311, 321 and 331 have a curved shape along an end face Se of a substrate S, and the other configuration is the same as in the first embodiment. Therefore, the following description is centered on points of difference and the same components are denoted by the same reference signs and are not described.

As shown in field (a) of FIG. 9, on a contact surface 321, a curved region 323 intersecting a virtual horizontal plane including the substrate S placed on the upper surface of a substrate holder 2 functions as a "contactable region" of the invention. That is, the contact surface 321 is finished such that a center of curvature of the curved region 323 is located on the side of the substrate S and a radius of curvature of the curved region 323 is larger than a radius of the substrate S. Accordingly, at the time of centering, the contact member 32 contacts the end face Se of the substrate S at one or two points in the curved region 323 if the contact member 32 is moved toward the end face Se of the substrate S. That is, as shown in FIG. 9, if the substrate S is placed on the upper surface of a spin base 21 with a notch NT facing the contact surface 321, two contact points P1, P2 on the curved region 323 are locked by shoulder parts of the notch NT, which can effectively prevent a part of the contact member 32 from entering the notch NT. Further, the contact surface 321 moves to a position P3 closer to the substrate S by an eccentric deviation amount Lc than a position P0 where the contact surface 321 is positioned in contact with the end face Se of the substrate S, but the eccentric deviation amount Lc is smaller than the eccentric deviation amount La in the first embodiment. This point applies also to the contact surface 311 of the contact member 31 and the contact surface 331 of the contact member 33.

Figure 10:
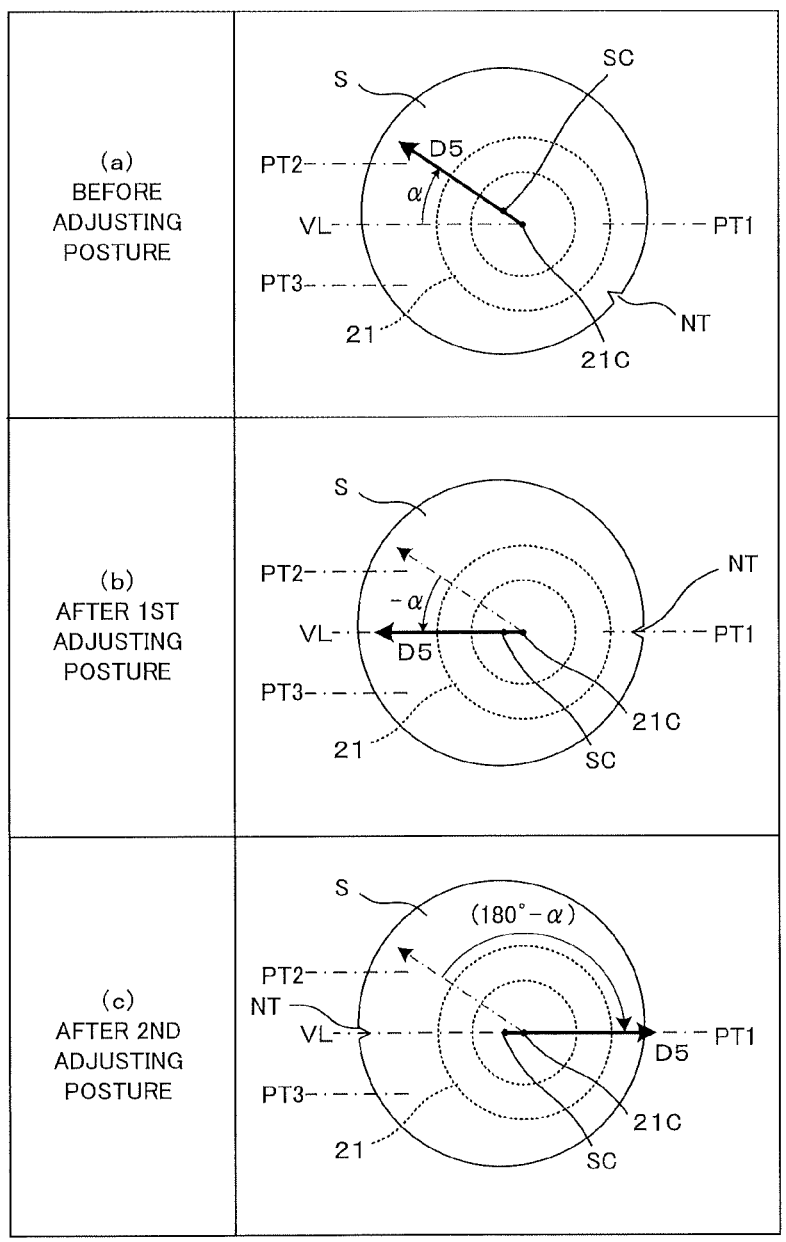
FIG. 10 is a graph showing a change of the eccentric deviation amount in relation to a degree of curvature (radius of curvature) of the contact surface.

Here, if an eccentric deviation amount by the notch NT (angle of 1.119°) provided in the substrate S (semiconductor wafer having a radius of 150 mm) was obtained while the radius of curvature was changed in multiple stages, an experimental result shown in FIG. 10 was obtained. That is, the eccentric deviation amount L decreases as the radius of curvature approaches the radius of the substrate S. If the radius of curvature and the radius of substrate coincide, there is theoretically no influence of the notch NT. However, in consideration of tolerances of the substrate S, it is actually unusable to cause the radius of curvature to coincide with the radius of the substrate S. Therefore, in the third embodiment, the contact surfaces 311, 321 and 331 are finished such that radii of curvature of the curved regions 313, 323 and 333 are larger than the radius of the substrate S.

In the above first to third embodiments, the contact member 31 to 33 may contact the notch NT corresponding to an example of a "cut" of the invention during the centering operation in Step S15. However, the influence of the notch NT can be eliminated and centering accuracy can be further enhanced by adopting the following configuration (fourth embodiment). A fourth embodiment of the centering device according to the invention is described below with reference to FIGS. 10 and 11.

FIG. 10 is a table schematically showing a state of changing a positional relationship of contact members and a notch by the posture adjustment of a substrate. For example, a case is considered where the notch NT of the substrate S is located in a direction opposite to the direction of eccentricity D5 as shown in field (a) of FIG. 10 when the substrate S is placed on the spin base 21 (Step S11). In the first embodiment, the posture of the substrate S is so adjusted that the direction of eccentricity D5 is parallel to the virtual line VL and oriented in the X1 direction (first posture adjustment). Then, as show in field (b) of FIG. 10, the notch NT of the substrate S is located on a movement path PT1 of the first contact member 31 after this first posture adjustment. Therefore, the first contact member 31 contacts the notch NT during the centering operation.

Here, the posture of the substrate S may be so adjusted that the direction of eccentricity D5 is parallel to the virtual line VL and the oriented in the X2 direction (second posture adjustment) to obtain functions and effects similar to those of the first to third embodiments. Moreover, as shown in field (c) of FIG. 10, the notch NT of the substrate S is located on none of movement paths PT1 to PT3 of the contact members 31 to 33 after this second posture adjustment. Therefore, during the centering operation, none of the contact members 31 to 33 contacts the notch NT and the influence of the notch NT can be eliminated.

Figure 11:
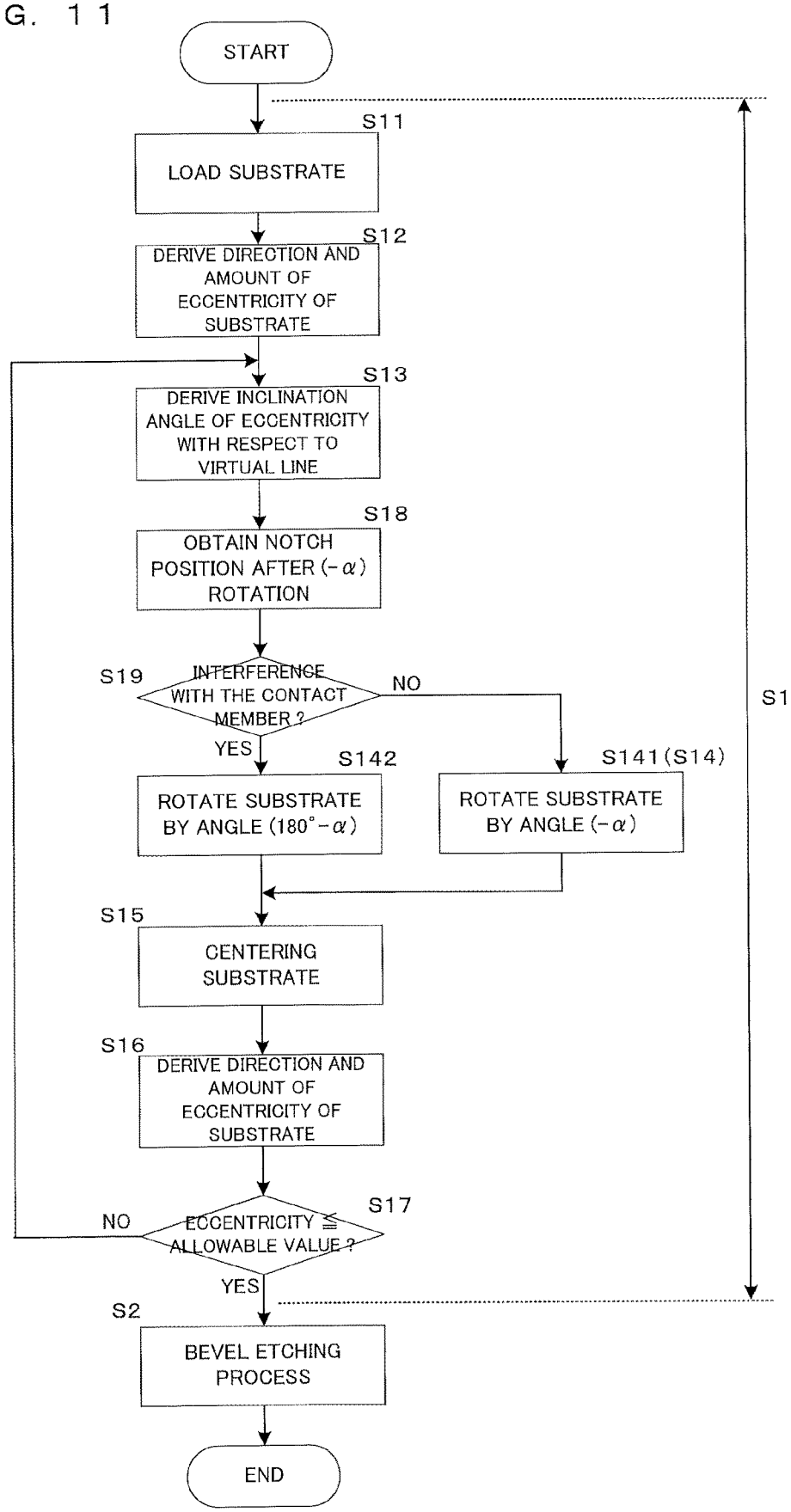
FIG. 11 is a flow chart showing the operation of the fourth embodiment of the centering device according to the invention.

Accordingly, in the fourth embodiment, the arithmetic processor 91 further enhances the accuracy of the centering operation by controlling each component of the device as shown in FIG. 11.

FIG. 11 is a flow chart showing the operation of the fourth embodiment of the centering device according to the invention. This fourth embodiment largely differs from the first embodiment in that the following two operations are performed before the centering of the substrate S (Step S15) is performed. That is, points of difference are that cut position information on the relative position of the notch NT with respect to the direction of eccentricity is acquired and that the substrate S is switched between the first posture and the second posture to deviate the notch NT from the movement paths PT1 to PT3 of all the contact members 31 to 33. The other configuration is basically the same as in the first embodiment. Therefore, the following description is centered on the points of difference.

The arithmetic processor 91 derives the direction of eccentricity D5, the amount of eccentricity and the cut position information of the notch NT (Step S12) after the substrate S is placed on the spin base 21 (Step S11). Out of these pieces of information, the cut position information of the notch NT is important. That is, by using the cut position information, the arithmetic processor 91 verifies whether or not the notch NT is located on the movement path PT1 to PT3 when the substrate S is rotated toward an opposite side by the angle of inclination a of the direction of eccentricity D5 with respect to the virtual line VL (Steps S18, S19). That is, if it is judged that the notch NT is located on none of the movement paths PT1 to PT3 and interference with the contact member does not occur when the substrate S is switched to the first posture, the arithmetic processor 91 adjusts the posture of the substrate S to the first posture by rotating the substrate S by (−a) as in Step S14 of the first embodiment (Step S141). Conversely, if it is judged that the notch NT is located on any one of the movement paths PT1 to PT3 and interference with the contact member occurs when the substrate S is switched to the first posture, the arithmetic processor 91 adjusts the posture of the substrate S to the second posture by rotating the substrate S by (180-a) (Step S142).

As just described, in the fourth embodiment, the arithmetic processor 91 functions as a substrate posture adjuster for selectively switching the posture of the substrate S between the first posture where the direction of eccentricity D5 is oriented toward a side opposite to the first contact member 31, i.e. oriented in the X1 direction and the second posture where the direction of eccentricity D5 is oriented toward the first contact member 31, i.e. oriented in the X2 direction. In this way, the substrate S is adjusted to the posture where the notch NT is located on none of the movement paths PT1 to PT3.

After this substrate posture adjustment, the arithmetic processor 91 performs the bevel etching process (Step S2) and unloads the substrate S from the substrate processing apparatus 10 as in the first embodiment.

As described above, according to the fourth embodiment, not only functions and effects similar to those of the first to third embodiments are obtained, but also the influence of the notch NT can be eliminated. Thus, the centering accuracy can be further enhanced.

In the above first to fourth embodiments, the highly accurate centering operation can be performed by adjusting the posture of the substrate S before the centering of the substrate S shown in FIG. 5 is performed. That is, in the centering devices and methods according to the first to fourth embodiments, an example of a "precision positioning mode" of the invention is executable. Here, if the posture adjustment of the substrate S is omitted, the positioning of the substrate S can be performed at a higher speed accordingly. That is, an example of a "high-speed positioning mode" of the invention is executable. Accordingly, after the substrate processing apparatus 10 having the configuration shown in FIGS. 2 and 3 selects and executes the precision positioning mode or the high-speed positioning mode, the bevel etching process may be performed (fifth embodiment).

Figure 12:
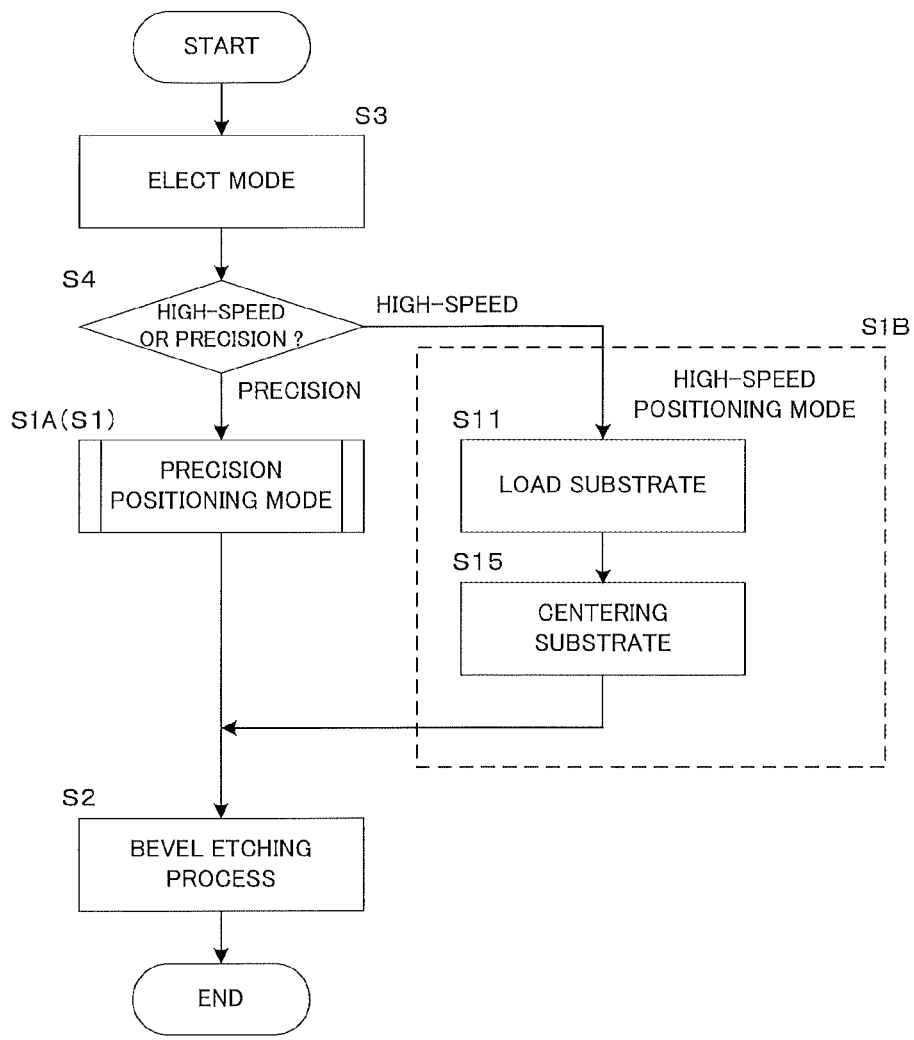
FIG. 12 is a flow chart showing the operation of a fifth embodiment of the centering device according to the invention.

FIG. 12 is a flow chart showing the operation of a fifth embodiment of the centering device according to the invention. In this fifth embodiment, the arithmetic processor 91 selects the precision positioning mode or the high-speed positioning mode in accordance with a command from an operator or a recipe set in advance (Step S3). Then, in next Step S4, the arithmetic processor 91 selects and executes the precision positioning mode (Step S1A) of the first to fourth embodiments or the high-speed positioning mode (=Step S1B in which Steps S11 and S15 are performed in this order) according to the selected mode. Thereafter, the bevel etching process (Step S2) is performed.

By having two types of positioning modes and selectively executing these positioning modes in this way, substrate processing (=centering operation+bevel etching process) can be performed with high versatility.

Note that the invention is not limited to the above embodiments and various changes other than the aforementioned ones can be made without departing from the gist of the invention. For example, in the above-described embodiments, nipping the substrate S with the contact members 31 to 33, namely, completion of the centering operation is detected on the basis of variation in a load torque. For example, the single mover 35 and the multi-mover 36 may be provided with a sensor such as a load sensor or strain gauge, a stress or strain may be detected by the sensors when the substrate S is sandwiched by the contact members 31 to 33 and detection signals may be output. In this case, the controller 9 confirms the sandwiching of the substrate S by the contact members 31 to 33 based on the detection signals from the sensors.

In the embodiment described above, the two contact members 32 and 33 are moved in the D2 direction (X2 direction) and in the D3 direction (X2 direction) respectively by the multi-mover 36. However, the multi-mover 36 may be replaced with a single mover for the contact member 32 and a single mover for the contact member 33 each having the same configuration as the single mover 35.

Like in this case, if the single mover for the contact member 32 and the single mover for the contact member 33 are provided, both the D2 direction and the D3 direction are not required to conform to the X2 direction but at least one of the D2 direction and the D3 direction may be changed from the X2 direction.

In the above-described embodiments, the present invention is applied to the centering device provided to the substrate processing apparatus 10 that performs the bevel etching process. Meanwhile, the centering device according to the present invention is applicable to every type of centering device provided to a substrate processing techniques that performs a process while rotating a substrate of a circular plate shape and to and every type of centering method. Also, the centering device according to the present invention may be used alone.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

This invention can be applied to a centering technique for aligning a center of a disk-shaped substrate placed on the upper surface of a substrate support with a center of the substrate support and a substrate processing apparatus in general for processing a substrate utilizing the centering technique.

What is claimed is:

1. A centering device for positioning a substrate on a substrate support such that a center of a disk-shaped substrate placed in a horizontal posture on an upper surface of the substrate support is aligned with a center of the substrate support, the device comprising:
   a first contact member movable in a first horizontal direction from a first reference position separated from the center of the substrate support by a reference distance longer than a radius of the substrate toward the center of the substrate support in a horizontal plane;
   a second contact member movable in a second horizontal direction from a second reference position deviated from a virtual line extending in the first horizontal direction from the center of the substrate support and separated from the center of the substrate support by the reference distance on a side opposite to the first contact member with respect to the center of the substrate support in the horizontal plane, the second horizontal direction being different from a direction toward the center of the substrate support and extending toward the substrate;
   a third contact member movable in a third horizontal direction from a third reference position separated from the center of the substrate support by the reference distance on a side opposite to the first contact member with respect to the center of the substrate support and opposite to the second contact member with respect to the virtual line in the horizontal plane, the third horizontal direction being different from a direction toward the center of the substrate support and extending toward the substrate;
   a moving mechanism configured to move the first contact member, the second contact member and the third contact member respectively in the first horizontal direction, the second horizontal direction and the third horizontal direction;
   a rotation driver configured to rotate the substrate support having the substrate placed thereon,
   a meter configured to measure a peripheral edge part of the substrate placed on the substrate support with the first contact member, the second contact member and the third contact member separated from an end surface of the substrate; and
   a controller configured to perform an alignment of the substrate with respect to the substrate support by controlling the moving mechanism and the rotation driver, wherein the controller includes:
an eccentricity information acquirer configured to acquire a direction of eccentricity of the center of the substrate from the center of the substrate support based on peripheral edge information about the peripheral edge part of the substrate measured by the meter;
a substrate posture adjuster configured to adjust a posture of the substrate such that the direction of eccentricity is parallel to the virtual line by rotating the substrate support; and
a movement controller configured to repeat minute movements of moving the first contact member, the second contact member and the third contact member respectively by a first movement amount, a second movement amount and a third movement amount until contact of all of the first contact member, the second contact member and the third contact member with the substrate is completed so that distances of the first contact member, the second contact member and the third contact member from the center of the substrate support are kept equal in a state where the direction of eccentricity is parallel to the virtual line.

2. The centering device according to claim 1, wherein:
the moving mechanism includes at least one or more motors configured to move the first contact member, the second contact member and the third contact member, and
the movement controller stops the repetition of the minute movements at a timing of confirming the contact of all of the first contact member, the second contact member and the third contact member with the substrate based on a load torque variation in the at least on or more motors.

3. The centering device of claim 1, wherein:
the substrate support is configured to be able to support the substrate provided with a cut in the peripheral edge part,
the eccentricity information acquirer is configured to acquire cut position information about a relative position of the cut with respect to the direction of eccentricity based on the peripheral edge information, and
the substrate posture adjuster is configured to adjust the posture of the substrate based on the cut position information such that the cut is deviated from movement paths of all of the first contact member, the second contact member and the third contact member.

4. The centering device of claim 3, wherein:
the substrate posture adjuster is configured to selectively switch the posture of the substrate between a first posture where the direction of eccentricity is oriented toward a side opposite to the first contact member and a second posture where the direction of eccentricity is oriented toward the first contact member.

5. The centering device of claim 4, wherein:
the substrate posture adjuster is configured to determine based on the cut position information whether or not the cut is located on the movement path of any one of the first contact member, the second contact member and the third contact member when the posture of the substrate is set to one of the first posture and the second posture, and to adjust the posture of the substrate to the one posture when the cut is not located on the movement path and adjusts the posture of the substrate to the other posture when the cut is located on the movement path.

6. The centering device of claim 1, wherein:
the controller is configured to selectively perform between a precision positioning mode and a high-speed positioning mode;
the precision positioning mode is for obtaining the direction of eccentricity from the center of the substrate from the center of the substrate support based on the peripheral edge information on the peripheral edge part of the substrate measured by the meter, adjusting a posture of the substrate such that the direction of eccentricity is parallel to the virtual line by rotating the substrate support and repeating the minute movements of moving the first contact member, the second contact member and the third contact member respectively by the first movement amount, the second movement amount and the third movement amount until the contact of all of the first contact member, the second contact member and the third contact member with the substrate is completed so that the distances of the first contact member, the second contact member and the third contact member from the center of the substrate support are kept equal in the state where the direction of eccentricity is parallel to the virtual line; and
the high-speed positioning mode is for repeating the minute movements of moving the first contact member, the second contact member and the third contact member respectively by the first movement amount, the second movement amount and the third movement amount until the contact of all of the first contact member, the second contact member and the third contact member with the substrate is completed so that the distances of the first contact member, the second contact member and the third contact member from the center of the substrate support are kept equal without adjusting the posture of the substrate after the substrate is placed on the upper surface of the substrate support.

7. A centering method for positioning a substrate on a substrate support such that a center of a disk-shaped substrate placed in a horizontal posture on an upper surface of the substrate support is aligned with a center of the substrate support, the method comprising:
(a) placing the substrate on the upper surface of the substrate support with a first contact member located at a first reference position separated from the center of the substrate support by a reference distance longer than a radius of the substrate, a second contact member located at a second reference position deviated from a virtual line extending through the center of the substrate support from the first reference position and separated from the center of the substrate support by the reference distance on a side opposite to the first contact member with respect to the center of the substrate support and a third contact member located at a third reference position separated from the center of the substrate support by the reference distance on a side opposite to the first contact member with respect to the center of the substrate support and opposite to the second contact member with respect to the virtual line;
(b) repeating minute movements of moving the first contact member in a first horizontal direction from the first reference position toward the center of the substrate support by a first movement amount, moving the second contact member in a second horizontal direction different from a direction toward the center of the substrate support and extending toward the substrate from the second reference position by a second movement amount and moving the third contact member in a third horizontal direction different from a direction toward the center of the substrate support and extending toward the substrate from the third reference position by a third movement amount so that distances of the first contact member, the second contact member and the third contact member from the center of the substrate support are kept equal with the substrate placed horizontally movably on the upper surface of the substrate support;
(c) stopping the minute movements if sandwiching of the substrate by the first contact member, the second contact member and the third contact member is confirmed while the minute movements are repeated; and
(d) adjusting a posture of the substrate placed on the upper surface of the substrate support before the operation (a) to the operation (c) are performed, wherein
the operation (d) includes:
(d-1) measuring a peripheral edge part of the substrate placed on the upper surface of the substrate support;
(d-2) acquiring a direction of eccentricity of the center of the substrate from the center of the substrate support based on peripheral edge information on the peripheral edge part of the substrate; and
(d-3) adjusting the posture of the substrate such that the direction of eccentricity is parallel to a virtual line extending through the center of the substrate support by rotating the substrate support.

8. The centering method according to claim 7, wherein:
the operation (d-1) includes supporting the substrate provided with a cut in the peripheral edge by the substrate support,
the operation (d-2) includes acquiring cut position information on a relative position of the cut with respect to the direction of eccentricity based on the peripheral edge information, and
the operation (d-3) includes adjusting the posture of the substrate such that the cut is deviated from movement paths of all of the first contact member, the second contact member and the third contact member based on the cut position information.

9. The centering method according to claim 7, wherein: a high-speed positioning mode and a precision positioning mode are selectively executable,
the high-speed positioning mode is for the positioning by performing the operation (a) to the operation (c) without adjusting the posture of the substrate after the substrate is placed on the upper surface of the substrate support, and
the precision positioning mode is for the positioning by performing the operation (a) to the operation (d).

10. A substrate processing apparatus, comprising:
a substrate support having an upper surface configured to support a substrate in a horizontal posture;
the centering device according to claim 1;
a suction unit configured to suck and hold the substrate on the substrate support by exhausting air between the substrate positioned by the centering device and the substrate support;
a rotation driver configured to rotate the substrate support sucking and holding the substrate about a center of the substrate support; and
a processing liquid supply mechanism configured to supply a processing liquid to a peripheral edge part of the substrate rotated about the center of the substrate support integrally with the substrate support.

* * * * *